United States Patent
Labbe et al.

(10) Patent No.: US 9,535,130 B2
(45) Date of Patent: Jan. 3, 2017

(54) BATTERY CURRENT SENSOR HAVING A MAGNETIC FIELD SENSOR

(75) Inventors: Arnaud Labbe, St. Girod (FR); Gérard Lepine, Peillonnex (FR); Erick Pauchet, Villy le Pelloux (FR)

(73) Assignee: LEM Intellectual Property SA, Fribourg (CH)

( * ) Notice: Subject to any disclaimer, the term of this patent is extended or adjusted under 35 U.S.C. 154(b) by 848 days.

(21) Appl. No.: 13/876,452

(22) PCT Filed: Sep. 23, 2011

(86) PCT No.: PCT/IB2011/054209
§ 371 (c)(1),
(2), (4) Date: Mar. 27, 2013

(87) PCT Pub. No.: WO2012/042457
PCT Pub. Date: Apr. 5, 2012

(65) Prior Publication Data
US 2013/0200903 A1     Aug. 8, 2013

(30) Foreign Application Priority Data

Sep. 28, 2010  (EP) .................................... 10180620

(51) Int. Cl.
*G01N 27/416*     (2006.01)
*G01R 31/36*      (2006.01)
(Continued)

(52) U.S. Cl.
CPC ....... *G01R 31/3606* (2013.01); *G01R 31/3696* (2013.01); *H01R 11/281* (2013.01);
(Continued)

(58) Field of Classification Search
USPC ......................................................... 324/473
See application file for complete search history.

(56) References Cited

U.S. PATENT DOCUMENTS

| 4,513,246 A * | 4/1985 | Blain ....................... G01R 1/22 324/117 R |
| 6,218,805 B1 * | 4/2001 | Melcher ............... G01R 31/362 320/105 |

(Continued)

FOREIGN PATENT DOCUMENTS

| DE | 10 2008 003 338 A1 | 7/2009 |
| EP | 0 214 532 A2 | 3/1987 |

(Continued)

OTHER PUBLICATIONS

International Search Report and Written Opinion issued by the European Patent Office, dated Dec. 14, 2011, for related International Application No. PCT/IB2011/054209; 12 pages.

*Primary Examiner* — Drew A Dunn
*Assistant Examiner* — Steve T Chung
(74) *Attorney, Agent, or Firm* — Faegre Baker Daniels LLP

(57) ABSTRACT

Battery current sensor comprising a battery post connection clamp portion (2) comprising a tubular clamping body configured to be clamped around a terminal post (3) of a battery (5), and a current sensing portion (16) comprising a magnetic circuit (16) and a magnetic field sensor (18). The magnetic circuit comprises a magnetic core surrounding the tubular clamping body (6).

5 Claims, 2 Drawing Sheets

(51) Int. Cl.
  *H01R 11/28* (2006.01)
  *H01R 13/66* (2006.01)
  *G01R 15/18* (2006.01)
  *G01R 15/20* (2006.01)

(52) U.S. Cl.
  CPC ....... *H01R 13/6683* (2013.01); *G01R 15/183* (2013.01); *G01R 15/20* (2013.01); *H01R 2201/26* (2013.01)

(56) References Cited

U.S. PATENT DOCUMENTS

| | | | | |
|---|---|---|---|---|
| 6,347,958 B1* | 2/2002 | Tsai | ................... | G01R 31/3686 340/653 |
| 6,551,147 B2 | 4/2003 | Wakata | .............. | G01R 31/3696 320/105 |
| 6,787,935 B2* | 9/2004 | Heim | .................... | G01R 1/203 307/10.1 |
| 7,405,570 B2* | 7/2008 | Hirthammer | ........ | H01R 11/281 307/10.1 |
| 8,305,034 B2* | 11/2012 | Rubio | .................... | G01R 1/203 320/104 |
| 8,476,864 B2* | 7/2013 | Ferre Fabregas | ...... | G01R 1/203 320/104 |
| 8,502,501 B2* | 8/2013 | Nentwig | ............ | G01R 31/3696 320/111 |
| 2003/0017753 A1 | 1/2003 | Palmisano et al. | | |
| 2008/0054881 A1* | 3/2008 | Kim | .................... | G01R 19/165 324/117 R |
| 2010/0019733 A1 | 1/2010 | Rubio | | |

FOREIGN PATENT DOCUMENTS

| | | |
|---|---|---|
| FR | 2 881 276 A1 | 7/2006 |
| JP | 2006038834 A | 2/2006 |
| JP | 2007214068 A | 8/2007 |
| JP | 2010048571 A | 3/2010 |
| JP | 2010048625 A | 3/2010 |
| WO | WO 2009/153036 A1 | 12/2009 |

* cited by examiner

BATTERY CURRENT SENSOR HAVING A MAGNETIC FIELD SENSOR

The present invention relates to a current sensor for a battery, in particular for a battery of the lead-acid type with posts for connection to positive and negative leads respectively.

Batteries of the lead-acid type are currently used in automobiles and in stand-by power applications as well as other applications. Such batteries have standardized connection posts for both the positive and negative connections, the posts having a truncated cone-shape with a small cone angle, the complementary connecting part typically comprising a tubular connection clamp with flanges that are squeezed together by means of a bolt to tighten the tubular body on the connection posts. A conducting cable for the power connection is usually welded, soldered, clamped, or crimped to the tubular connection clamp.

It is known to provide a current sensor around the conducting cable or in the region of the connection between the cable and the connecting clamp in order to measure the electrical current flowing in or out of the battery. Lead-acid batteries may supply currents over a very large operating range, from milli-amperes up to peaks of a few hundred, even a thousand or more amperes, for example when starting a combustion engine. The current sensor for such batteries thus needs to be robust and have dimensions sufficiently large to be able to support the very high peak currents without damage. In addition, it would be desirable to be able to measure such large currents.

Existing current sensors for battery post connection leads are bulky and costly and in view of their mounting around the connecting lead easily subject to damage, for example during mounting or maintenance. Such sensors are also subject to harsh operating conditions such as vibration, shock and a large range of operating temperatures from minus 40° to 125° that may be found in the engine compartment of an automobile.

It is an object of this invention to provide a current sensor for a battery with terminal connection posts, for example batteries of the lead-acid type used in automobiles or in stand-by applications, that is robust, reliable, compact and that can support harsh operating conditions such as a large temperature range, high temperatures, and/or vibration and shocks.

It is advantageous to provide a current sensor that is able to measure currents over a large range, from milli amperes to a few hundred or even a thousand or more amperes and yet that is compact and economical to manufacture.

It is advantageous to provide a current sensor for connection to a battery post that has a low exposure to damage during mounting, use or maintenance.

Objects of this invention have been achieved by providing the battery post current sensor according to claim 1.

Disclosed herein is a battery current sensor comprising a battery post connection clamp portion comprising a tubular split clamping body configured to be clamped around a terminal post of a battery, and a current sensing portion comprising a magnetic circuit and a magnetic field sensor. The magnetic circuit comprises a magnetic core surrounding the tubular clamping body. The battery post connection clamp portion comprises flanges extending from free ends of the tubular clamping body, configured to be biased together for tightening the tubular clamping body on a battery terminal post, the flanges having a height H2 that is less than a height H1 of the tubular clamping body. The magnetic circuit comprises a magnetic core surrounding a portion of the tubular clamping body adjacent the flanges.

Advantageously, a particularly compact and low profile sensor integrated in a connection clamp is provided, yet in view of the large diameter magnetic circuit surrounding the connection post is able to reliably measure large electrical currents. Integration of the magnetic circuit and magnetic field sensor around the battery connection post provides a particularly compact arrangement and reduces exposure of the sensor to external objects during assembly, use or maintenance, the sensor being partially protected by the connection clamp itself. Moreover, as the magnetic circuit surrounds the battery post, the sensor accurately measures the entire current flowing in and out of the battery including any leakages or secondary conductors that may be connected or tapped off the connection clamp or conducting lead. In conventional sensors, a short circuit or secondary conductor connected to the battery terminal post may not be detected since the sensor is arranged on or around the main conducting lead.

Another advantage of the invention is that the sensing function is configured in parallel to the primary conductor and does not insert between the connection between the battery lead and the battery terminal. An interruption of the primary conductor line introduces further risks of failure and renders the cable to battery connection more complex.

A temperature sensor may also be directly integrated in the current sensor. Since it is mounted on the connection clamp that fits on the battery post terminal, an accurate temperature measurement of the battery in a compact and cost effective configuration is provided.

The flanges may advantageously be positioned at a top end of the tubular clamping body and the magnetic circuit positioned below the flanges towards a bottom end of the clamping body.

The magnetic circuit may advantageously be positioned in the current sensor such that when the current sensor is mounted on a battery post the magnetic circuit is proximate and adjacent an upper outer surface of the battery.

The sensor advantageously comprises an insulating and protective housing surrounding the magnetic circuit, magnetic field sensor and at least a portion of the tubular clamping portion. The sensor may further comprise a connector having a housing portion integrally formed with the current sensor housing and configured for connection to a connector of external circuitry.

In an embodiment, the magnetic circuit comprises a magnetic core having an air gap, the magnetic field sensor being positioned in the air gap. The magnetic circuit and magnetic field detector may be configured to operate as an open-loop current sensor. The magnetic field sensor may include a circuit board on which a magnetic field detector such as a Hall effect detector, is mounted.

Further objects and advantageous aspects of the invention will be apparent from the claims, the following detailed description and of an embodiment of the invention and the annexed drawings in which:

Figure 1:
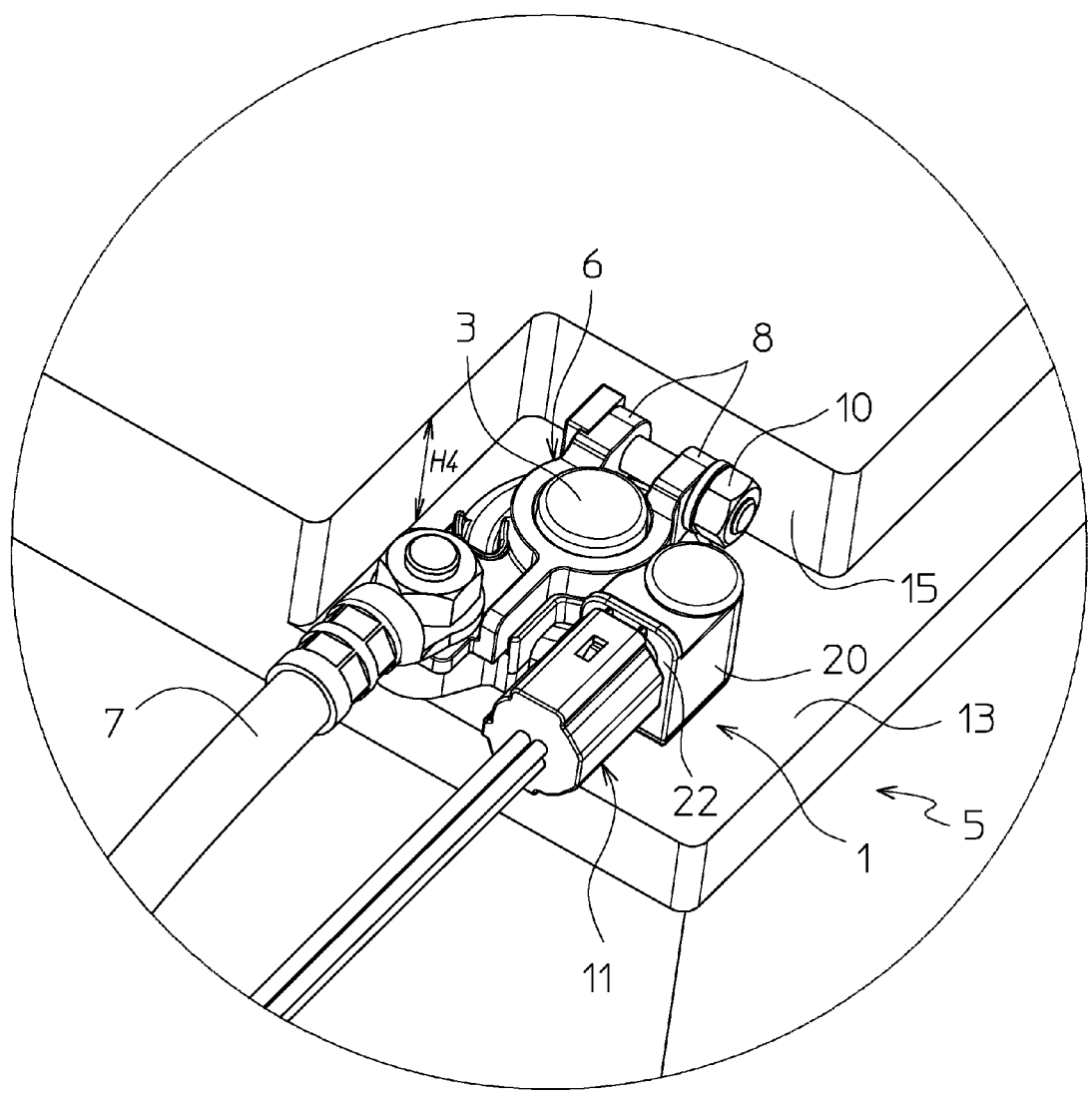
FIG. 1 is a view of a battery current sensor according to the invention mounted on a battery terminal post.

Referring to the figures, a battery current sensor 1 according to an embodiment of this invention comprises a battery post connection clamp portion 2 and a current sensing portion 4. The battery post connection clamp portion is mountable around a battery post 3 of a battery 5 that may typically be of the lead-acid type that is widely used in automotive, stand-by and other applications. The battery post may have standardized dimensions with a slightly conical clamping surface as per se well-known. The invention however may also be for batteries of other types or for battery terminal posts that are cylindrical or slightly conical of non-standardized dimensions.

The battery post connection clamp portion 2 comprises a split tubular clamping body 6 with flanges 8 extending outwardly and generally radially from free ends of the clamping body, the flanges having passages to receive a clamping bolt 10 therethrough, the clamping bolt may press the flanges together thus clamping the tubular body around the battery terminal post 3. The tubular body has an axial height H1 that is greater than the axial height H2 of the flanges. The flanges extend, in a preferred embodiment, from an upper surface 9 of the tubular body as seen in relation to the mounting position of the clamping body on a battery post. A certain space H3 below the flange is thus provided to allow a magnetic circuit of the current sensing portion to be positioned around the tubular clamping body as will be described in more detail further on. The battery post connection clamp portion further comprises a primary cable connection portion 12 for connection to a main conducting lead 7 and optionally connection portions for connecting other leads to the battery post. The connection portions for the primary cables and secondary cables may have various shapes and configurations as known in the art.

The current sensing portion 4 comprises a magnetic circuit 16 with an annular shaped magnetic core that surrounds the battery post, and a magnetic field sensor 18. The magnetic field sensor detects the magnetic field generated by the electrical current flowing through the battery post, whereby the magnetic core of the magnetic circuit concentrates the magnetic flux. In the embodiment shown, the magnetic core is provided with an air gap and the magnetic field detector is inserted in the air gap in order to pick up the concentrated magnetic field in the air gap. The magnetic field sensor may comprise a Hall effect sensor 24 that is for example integrated in an ASIC that is mounted on a circuit board, for example a printed circuit board 26. Other magnetic field sensors may however also be used. The printed circuit board may also be provided with other electrical and electronic circuitry for signal processing and supply. In the configuration shown and discussed above the current sensor may function in an open-loop manner (known as an open-loop current sensor) which means that there is no feed-back signal that is used to cancel the magnetic field in the magnetic circuit.

The magnetic core may be made of soft magnetic material in the form of a non-laminated core or in the form of stacked laminated sheets to reduce eddy currents as is known in the art.

Within the scope of the invention other magnetic field detectors and magnetic circuit configurations may be used. For example, other magnetic field detectors such as fluxgate or magneto-resistive detectors may however be used instead of Hall effect detectors. Also, the magnetic core may be closed i.e. without air gap, and the current sensor may function in a closed-loop manner and comprise a secondary coil wound around the magnetic circuit that is driven with a current that seeks to cancel the magnetic field generated by the current flowing through the battery post.

Figure 3:
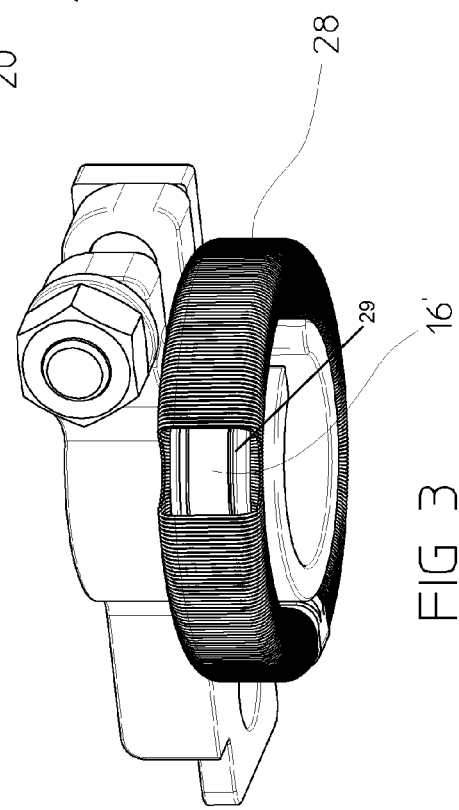
FIG. 3 is a perspective view of a battery current sensor, with the housing removed in order to see the magnetic field sensor according to another embodiment of the invention.

Referring to FIG. 3 (in conjunction with FIG. 1), an example of another embodiment of a magnetic field detector is shown. The magnetic field detector of FIG. 3 is of the fluxgate type comprising a magnetic circuit with an annular shaped saturable magnetic core 16' that surrounds the battery post. The saturable magnetic core 16' may be made of an amorphous magnetic material ribbon or strip wound around an insulating support 29. A coil 28 is wound around the magnetic core and insulating support, and is configured to be connected to a signal processing circuit (via the connector portion 22 as illustrated in FIG. 1) that generates an alternating excitation current and reads the resulting signal bias that is an image of the primary current flowing through the battery terminal. The functioning principle of the fluxgate sensor of this type is per se known. Other fluxgate configurations could also be used in the present invention, for example with separate excitation and compensation coils.

Figure 2A:
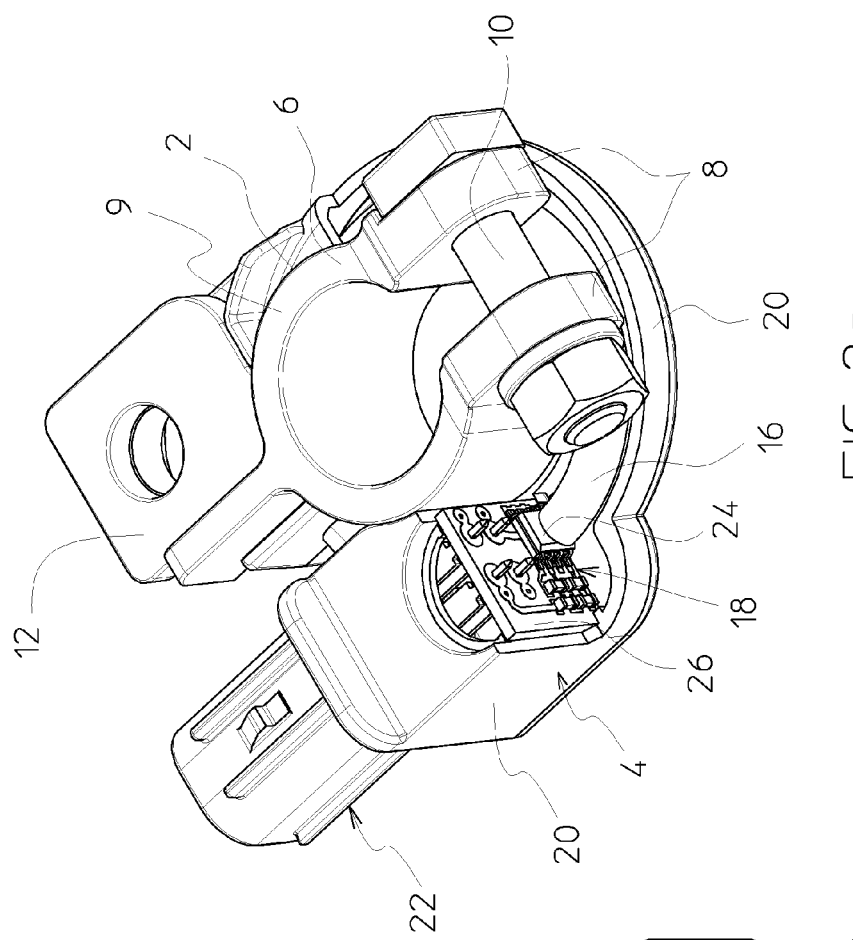
FIG. 2a is a perspective view of a battery current sensor, with a portion of the housing cut away for better visibility, according to an embodiment of the invention.
Figure 2B:
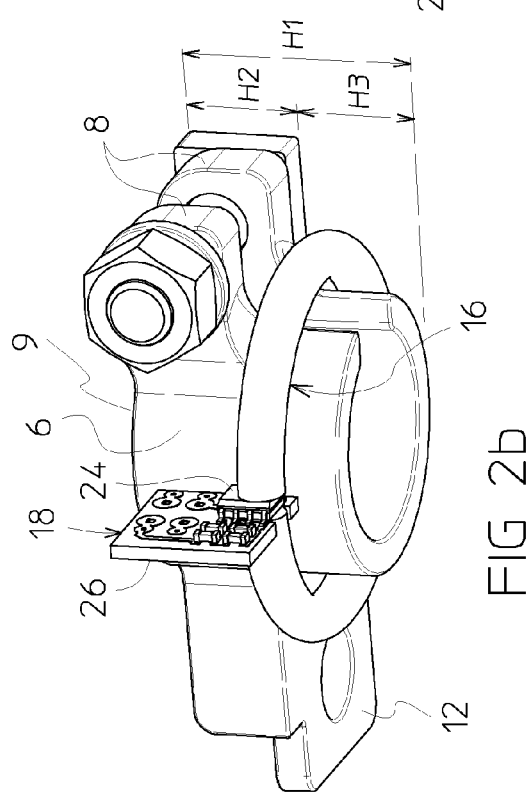
FIG. 2b is another perspective view of the sensor of FIG. 2a with further housing parts and components removed in order to see the magnetic circuit and the magnetic field sensor.

An advantageous embodiment is the open-loop configuration as illustrated in FIGS. 2a, 2b in view of the low cost and simple and reliable operation as well as the ability to measure high currents.

The current sensing portion 4 further comprises a housing 20 that provides insulation and protection to the magnetic circuit and magnetic field sensor, and a connector 2 with a housing portion integrally formed in the housing 20 for connection of the current sensor to external circuitry. The housing 20 is formed around and fixed to the battery post connection clamp portion 2. The magnetic circuit 16 is advantageously positioned below the flanges 8 and surrounding the lower portion of the tubular body 6 thus forming a particularly compact and well-protected current sensing portion. Protection of the current sensing portion is also enhanced as it is arranged under the flanges 8 and clamping bolt 10 for positioning against or right next to a surface 13 of the battery 5 under the clamping bolt. The battery current sensor preferably has an overall height that is equal or less that the height H4 of the battery terminal well 15 so that the sensor does not protrude above the uppermost surface of the battery.

Also, as the magnetic circuit surrounds the battery post all electrical current flowing in or out the battery is measured irrespective of whether they are currently leaks or short circuits or secondary lines connected to the battery post where the current does not flow through the primary cable.

The current sensing portion may further comprise a temperature sensor housed in the housing 20 and connected either to the circuit board 26 of the magnetic field sensor or to separate circuitry and connectable with the current sensor to external circuitry via the connector 22 pluggable to an external connector 11. Inclusion of a temperature sensor within the current sensing portion provides a particularly compact and well-protected arrangement that nevertheless allows accurate measurement of the battery temperature through the very close connection to the battery post. The temperature sensor may for example include a thermocouple (not shown) that is mounted against or fixed on the outer surface of the tubular body 6 of the connection clamping portion 2.

An insulating resin may be injected inside the housing 20 to fill up the free space in the housing and secure the magnetic circuit and magnetic field detector and other components within the housing.

As the magnetic core of the magnetic circuit surrounds the tubular clamping body that is clamped around the battery post the magnetic circuit has a relatively large diameter, much larger than would normally be provided around a cable or lead connected to the clamp, this enables the current sensing portion to measure large amplitude currents in a particularly compact configuration that is also well protected.

The invention claimed is:

1. A battery current sensor comprising a battery post connection clamp portion comprising a split tubular clamping body configured to be clamped around a terminal post of a battery, flanges extending from free ends of the split tubular clamping body, configured to be biased together for tightening the tubular clamping body on a battery terminal post, a current sensing portion comprising an annular magnetic core with an air gap, a magnetic field sensor comprising a magnetic field detector inserted in the air gap, an insulating sensor housing portion surrounding the magnetic core and at least a portion of the tubular clamping portion, and a connector having a housing portion integrally formed with said sensor housing portion and configured for releasable pluggable connection to a connector of external circuitry, wherein the flanges have a height (H2) that is less than a height (H1) of the tubular clamping body and wherein the magnetic core with air gap encircles a portion of the tubular clamping body adjacent the flanges, and wherein the flanges are positioned at a top end of the tubular clamping body and the magnetic core is positioned below the flanges towards a bottom end of the clamping body, such that when the current sensor is mounted on a battery post, the magnetic core is proximate and adjacent an upper outer surface of the battery, the magnetic field sensor further comprising a circuit board on which the magnetic field detector is mounted, the circuit board being oriented substantially parallel to a central axis of the split tubular clamping body.

2. The battery current sensor according to the claim 1, wherein said top end of the tubular clamping body has an inner diameter smaller than an inner diameter of said bottom end of the tubular clamping body.

3. The battery current sensor according to claim 1, further comprising a temperature sensor mounted in the housing.

4. The battery current sensor according to claim 1, wherein the current sensor has an overall height and size configured to fit within a terminal post well of an automotive battery of the lead-acid type.

5. The battery current sensor according to claim 1, wherein the current sensing portion comprises a secondary coil wound around the magnetic circuit that is driven with a current that seeks to cancel the magnetic field generated by the current flowing through the battery post.

* * * * *